(12) United States Patent
Lin et al.

(10) Patent No.: US 11,799,429 B2
(45) Date of Patent: Oct. 24, 2023

(54) MULTI-FREQUENCY BAND COMMUNICATION BASED ON FILTER SHARING

(71) Applicant: Apple Inc., Cupertino, CA (US)

(72) Inventors: Saihua Lin, Santa Clara, CA (US); Hongrui Wang, San Jose, CA (US); Sohrab Emami-Neyestanak, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 36 days.

(21) Appl. No.: 17/481,092

(22) Filed: Sep. 21, 2021

(65) Prior Publication Data

US 2022/0045653 A1    Feb. 10, 2022

Related U.S. Application Data

(63) Continuation of application No. 16/917,325, filed on Jun. 30, 2020, now Pat. No. 11,211,906.

(51) Int. Cl.
   *H03F 1/12*       (2006.01)
   *H03F 3/195*      (2006.01)
   *H03F 3/213*      (2006.01)

(52) U.S. Cl.
   CPC ............ *H03F 3/195* (2013.01); *H03F 3/213* (2013.01); *H03F 2200/294* (2013.01); *H03F 2200/451* (2013.01)

(58) Field of Classification Search
   CPC ......................................................... H03F 1/12
   USPC ........................................................... 330/51
   See application file for complete search history.

(56) References Cited

U.S. PATENT DOCUMENTS

| | | |
|---|---|---|
| 6,233,434 B1 | 5/2001 | Takei |
| 7,622,989 B2 | 11/2009 | Tzeng et al. |
| 8,660,041 B2 | 2/2014 | Niskanen et al. |
| 8,971,830 B2 | 3/2015 | Hadjichristos et al. |
| 9,380,253 B2 | 6/2016 | Petrovic et al. |
| 10,075,199 B2 | 9/2018 | King et al. |
| 11,064,491 B2 | 7/2021 | Balteanu |
| 2006/0135083 A1 | 6/2006 | Leinonen et al. |
| 2009/0130993 A1 | 5/2009 | Rofougaran et al. |
| 2010/0273253 A1 | 10/2010 | Teixeira De Oliveira et al. |

(Continued)

FOREIGN PATENT DOCUMENTS

| | | |
|---|---|---|
| CN | 1246774 A | 3/2004 |
| CN | 101641868 A | 2/2010 |

(Continued)

OTHER PUBLICATIONS

Chinese Office Action for Chinese Patent Application No. 2021107291686, dated Jul. 21, 2022; 6 pgs.

(Continued)

*Primary Examiner* — Henry Choe
(74) *Attorney, Agent, or Firm* — FLETCHER YODER PC

(57) ABSTRACT

The present disclosure relates to systems and methods for operating transceiver circuitry to transmit or receive signals on various frequency ranges. To do so, a transmitter or a receiver of the transceiver circuitry is selectively coupled to or uncoupled from an antenna of the transceiver circuitry. Additionally, radio frequency filters may be individually or collectively coupled to and/or uncoupled from the antenna to filter different frequencies in the transmitting or receiving signals.

20 Claims, 11 Drawing Sheets

(56) References Cited

U.S. PATENT DOCUMENTS

| | | | |
|---|---|---|---|
| 2013/0176913 A1 | 7/2013 | Niskanen et al. | |
| 2015/0304596 A1 | 10/2015 | Petrovic et al. | |
| 2016/0134414 A1* | 5/2016 | Pehlke | H04B 1/0057 |
| | | | 370/280 |
| 2016/0261901 A1* | 9/2016 | Petrovic | H04N 21/6168 |
| 2016/0380681 A1 | 12/2016 | Singh | |
| 2017/0047636 A1* | 2/2017 | Lee | H01Q 5/321 |
| 2017/0373819 A1 | 12/2017 | Liu et al. | |
| 2018/0152945 A1 | 5/2018 | Balteanu | |
| 2019/0181825 A1 | 6/2019 | Schmalzl et al. | |
| 2021/0028870 A1* | 1/2021 | Balteanu | H04B 17/318 |

FOREIGN PATENT DOCUMENTS

| | | |
|---|---|---|
| CN | 107528598 A | 12/2017 |
| CN | 107787558 A | 3/2018 |
| CN | 109921808 A | 6/2019 |
| WO | 2008118190 A1 | 10/2008 |
| WO | 2009087438 A1 | 7/2009 |
| WO | 2009087448 A1 | 7/2009 |

OTHER PUBLICATIONS

Chinese Notice of Grant for Chinese Patent Application No. 2021107291686, dated Dec. 7, 2022; 7 pgs.
Examination Report for Indian Patent Application No. 202114028503 dated May 25, 2022, 6 pages.

* cited by examiner

MULTI-FREQUENCY BAND COMMUNICATION BASED ON FILTER SHARING

CROSS-REFERENCE TO RELATED APPLICATION

This application claims priority to and the benefit of U.S. patent application Ser. No. 16/917,325, entitled "MULTI-FREQUENCY BAND COMMUNICATION BASED ON FILTER SHARING", filed Jun. 30, 2020, which is herein incorporated by reference in its entirety for all purposes.

BACKGROUND

The present disclosure relates generally to electronic devices, and more particularly, to electronic devices that utilize radio frequency signals, transmitters, and receivers for wireless communication.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Transmitters and/or receivers are commonly included in various electronic devices, and more particularly, portable electronic communication devices, such as phones (e.g., mobile and cellular phones, cordless phones, personal assistance devices), computers (e.g., laptops, tablet computers), routers (e.g., Wi-Fi routers or modems), radios, televisions, or any of various other stationary or handheld devices, to enable communication. In some electronic devices, a transmitter and a receiver are combined to form a transceiver. For ease of discussion, transceivers are discussed in the present disclosure, but it should be understood that the following descriptions may apply individually to transmitters and/or receivers (e.g., that may not be included in a transceiver).

Traditional electronic devices may include multiple sets of radio frequency filters that allow signals having desired frequencies to pass through and/or block signals having undesired frequencies. For example, a transmitter of an electronic device may include multiple transmit filters that each correspond to transmitting signals at different frequency bands, and a receiver of the electronic device may include multiple receive filters that each correspond to receiving signals at certain frequency bands. However, as new frequency bands are used for wireless communication, more radio frequency filters may be added to the electronic device to enable the electronic device to transmit and receive signals over the new frequency bands, taking up valuable space in the electronic devices.

Moreover, signal paths in conventional electronic devices may have lengths as long as a quarter-wavelength of a signal to be transmitted or received via the signal paths. While, such lengths may be used for signals having relatively narrow wavelength ranges, the quarter-wavelength signal paths may be unsuitable for communicating on wider bands of communication frequencies, such as a fifth generation (5G) network, since 5G communications use frequencies spanning a relatively large frequency band (e.g., between 24 Gigahertz (GHz) and 48 GHz).

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

An electronic device may include multiple radio frequency filters, and couple to a transmitter and a receiver to enable sharing of the radio frequency filters. In particular, the electronic device may dynamically couple an antenna to the transmitter to send transmission signals, and dynamically couple to the antenna to the receiver to receive receiving signals. The transmitter and receiver may each be dynamically coupled to multiple radio frequency filters, each of which may filter different frequency bands or ranges. Moreover, multiple radio frequency filters may be dynamically coupled to the transmitter and/or receiver at the same time to combine together and filter additional frequency bands.

Generally, the radio frequency filters may include a first radio frequency filter that enables signals of a first frequency band to pass through (e.g., while blocking signals outside of the first frequency band), a second radio frequency filter that enables signals of a second frequency band to pass through (e.g., while blocking signals outside of the second frequency band), and, when the first and second radio frequency filters are coupled together, the first and second radio frequency filters enable signals of a third frequency band to pass through (e.g., while blocking signals outside of the third frequency band). For example, in the case of ultra-wideband frequencies, such as those used by fifth generation (5G) networks (e.g., between 24 Gigahertz (GHz) and 48 GHz), the radio frequency filters may include a first radio frequency filter that enables signals of a first frequency band (e.g., between 24 GHz and 33 GHz) to pass through (e.g., in a first state), a second radio frequency filter that, when combined with the first radio frequency filter (e.g., in a second state), enables signals of a second frequency band (e.g., between 37 GHz and 43 GHz) to pass through, and a third frequency filter that, when combined with the first and second radio frequency filters (e.g., in a third state), enables signals of a third frequency band (e.g., between 47 GHz and 49 GHz) to pass through. It is noted that, although described in particular reference to 5G networks, and frequency bands used in the 5G networks, these systems and methods of filter sharing may be applied to a wide variety of networks and frequency ranges as long as the networks and/or frequency ranges are able to share antenna circuitry. Indeed, these systems and methods may be applied to antennas used to transmit and/or receive signals for 4G network communication, 3G network communications, 2G network communications, or the like.

By enabling both the transmitter and receiver to use the same radio frequency filters, and using the radio frequency filters individually and in combination to filter different frequency bands, the number of filters in the electronic device may be significantly reduced, resulting in a smaller electronic device overall and/or enabling additional components to be included in the electronic device.

Indeed, in some cases, a device may include a first filter coupled to an antenna and a second filter coupled to a first low noise amplifier. The device may also include a third filter coupled to a second low noise amplifier and a controller. The controller may transmit a transmit signal on a first frequency band by coupling the first filter to a power amplifier, uncoupling the second filter from the antenna and the power amplifier, and uncoupling the third filter from the antenna and the power amplifier based at least in part on one or more control signals indicating a first state. The controller may transmit the transmit signal on a second frequency band by coupling the first filter to the power amplifier, coupling the second filter to the antenna and the power amplifier, and uncoupling the third filter from the antenna and the power amplifier based at least in part on the one or more control signals indicating a second state. The controller may transmit the transmit signal on a third frequency band by coupling the first filter to the power amplifier, coupling the second filter to the antenna and the power amplifier, and coupling the third filter to the antenna and the power amplifier based at least in part on the one or more control signals indicating a third state.

In some systems, an electronic device may include a first switch able to couple an antenna and a first filter to a first low noise amplifier via a second filter. The electronic device may include a second switch able to couple the antenna and the first filter to a second low noise amplifier via a third filter. The electronic device may also include a third switch able to couple the antenna and the first filter to a power amplifier. The electronic device may also include a controller. The electronic device may receive a receive signal on a first frequency band based on the controller activating the first switch to couple the first low noise amplifier and the second filter to the antenna and the first filter, and deactivating the second switch and the third switch to uncouple the second low noise amplifier, the third filter, and the power amplifier from the antenna. The electronic device may receive the receive signal on a second frequency band based on the controller activating the second switch to couple the second low noise amplifier and the third filter to the antenna and the first filter, and deactivating the first switch and the third switch to uncouple the first low noise amplifier, the second filter, and the power amplifier from the antenna. Furthermore, the electronic device may receive the receive signal on a third frequency band by activating the first switch and the second switch to couple the first low noise amplifier, the second filter, the second low noise amplifier, and the third filter to the antenna and the first filter, and deactivating the third switch to uncouple the power amplifier from the antenna.

In yet another example, a method may include receiving a frequency band parameter and a transmission or reception (TX/RX) parameter. The frequency band parameter and the TX/RX parameter may indicate an operational state of an antenna. The antenna may be coupled to a first filter and able to couple to at least one of a second filter or a third filter. In response to the TX/RX parameter indicating a transmission operation, the method may include coupling the antenna to a power amplifier, where the power amplifier may amplify a transmit signal associated with the transmission operation. In response to the frequency band parameter indicating a first frequency band, the method may include uncoupling the second filter and the third filter from the antenna. In response to the frequency band parameter indicating a second frequency band, the method may include coupling the second filter to the antenna and uncoupling the third filter from the antenna. In response to the frequency band parameter indicating a third frequency band, the method may include coupling the second filter and the third filter to the antenna. In some cases, the method may include transmitting the transmit signal using the power amplifier and the antenna.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Various processes are disclosed that may be used to adjust an operating frequency range of a transceiver. The processes may apply to a variety of electronic devices. In some embodiments, a control system (e.g., a controller) of an electronic device may couple or uncouple a transmitter and/or a receiver to or from an antenna. The control system may also couple or uncouple one or more radio frequency filters to and from the transmitter or receiver, individually or in combination, to filter signals of different frequencies. These processes bring certain advantages to operation, as is described herein. With the foregoing in mind, a general description of suitable electronic devices that may include such a transceiver is provided below.

Figure 1:
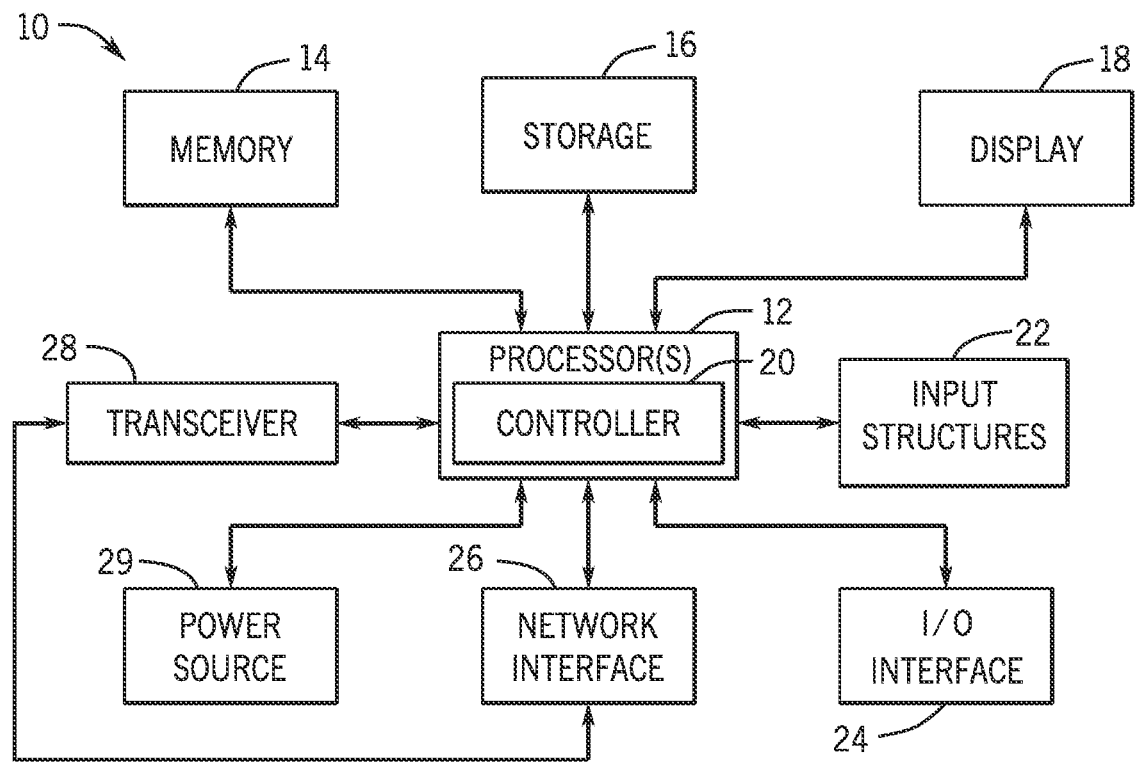
FIG. 1 is a schematic block diagram of an electronic device including a transceiver, in accordance with an embodiment.

Turning first to FIG. 1, an electronic device 10 according to an embodiment of the present disclosure may include, among other things, one or more of processor(s) 12, memory 14, nonvolatile storage 16, a display 18, a controller 20, input structures 22, an input/output (I/O) interface 24, a network interface 26, a transceiver 28, and a power source 30. The various functional blocks shown in FIG. 1 may include hardware elements (including circuitry), software elements (including computer code stored on a computer-readable medium) or a combination of both hardware and software elements. Furthermore, a combination of elements may be included in tangible, non-transitory, and machine-readable medium that include machine-readable instructions. The instructions may be executed by the processor 12 and may cause the processor 12 to perform operations as described herein. It should be noted that FIG. 1 is merely one example of a particular embodiment and is intended to illustrate the types of elements that may be present in the electronic device 10.

Figure 2:
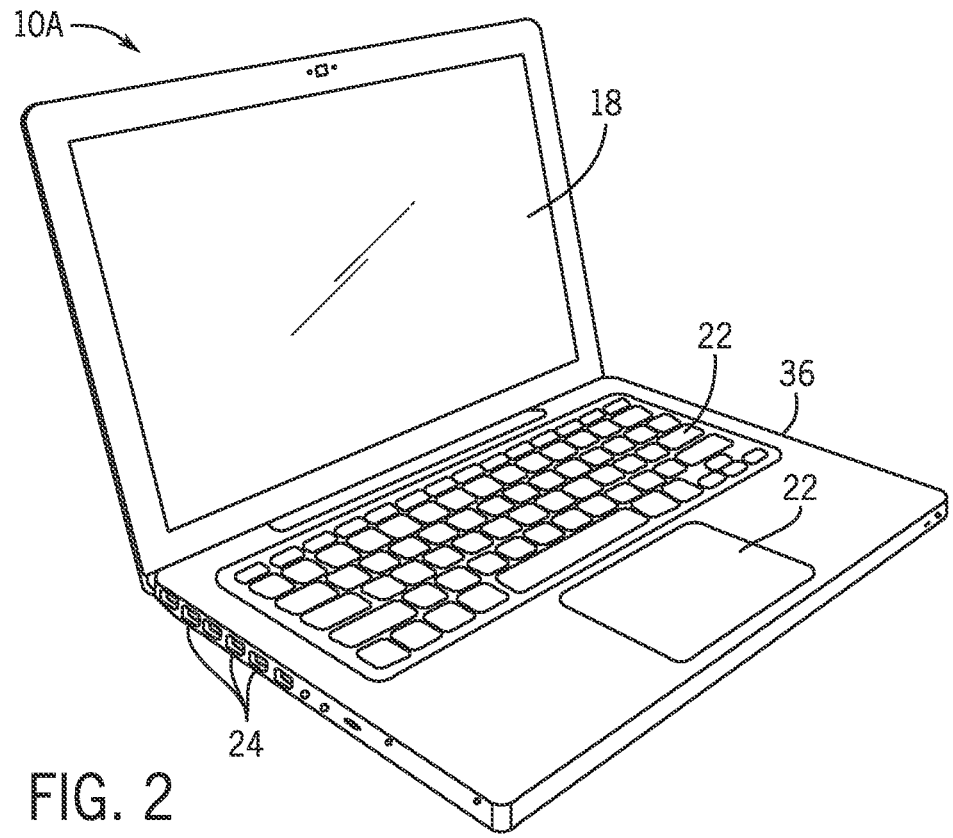
FIG. 2 is a perspective view of a notebook computer representing a first embodiment of the electronic device of FIG. 1.
Figure 4:
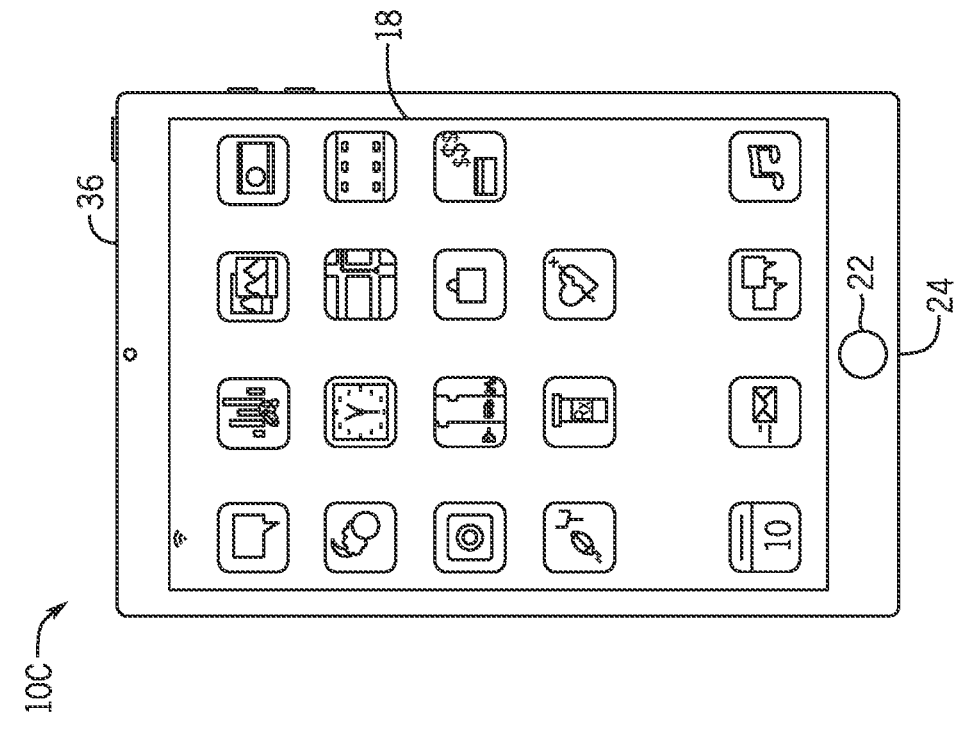
FIG. 4 is a front view of another handheld device representing a third embodiment of the electronic device of FIG. 1.
Figure 3:
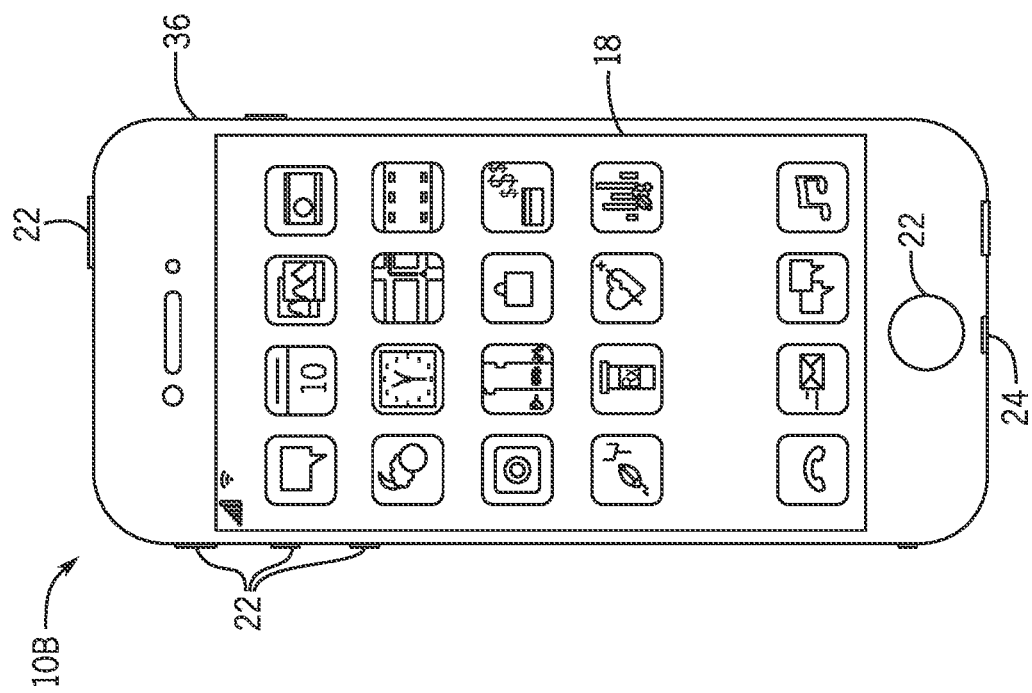
FIG. 3 is a front view of a handheld device representing a second embodiment of the electronic device of FIG. 1.
Figure 5:
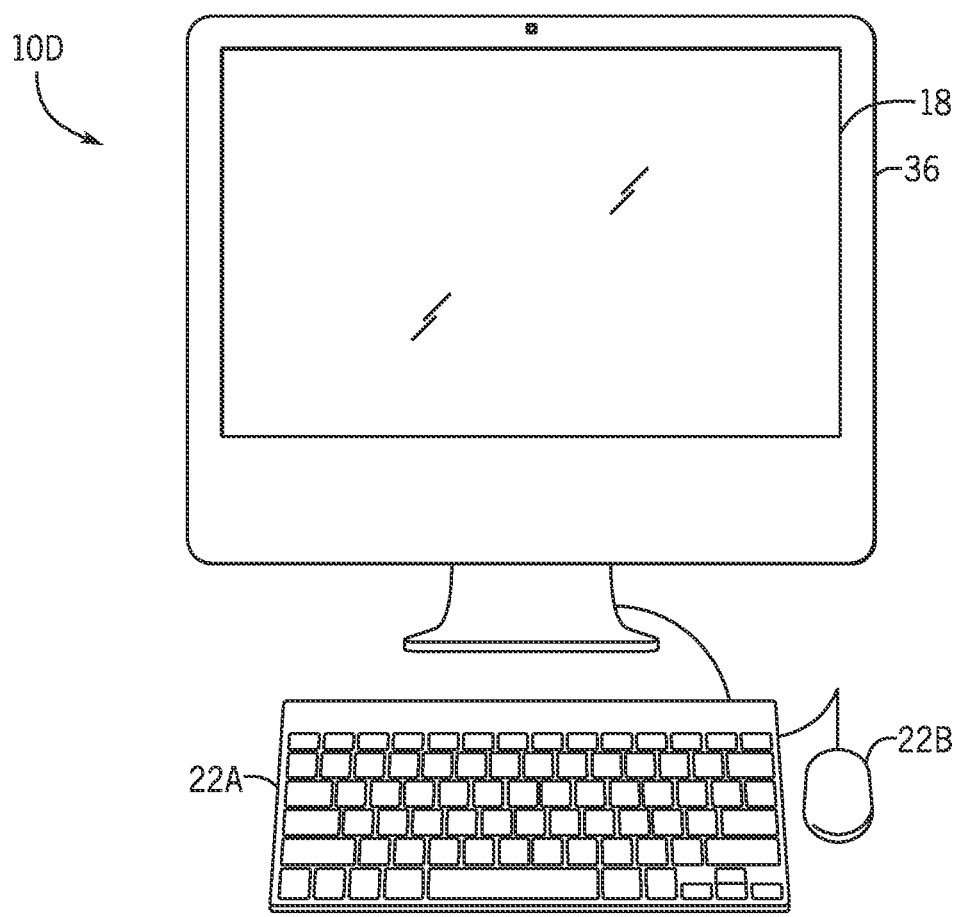
FIG. 5 is a front view of a desktop computer representing a fourth embodiment of the electronic device of FIG. 1.
Figure 6:
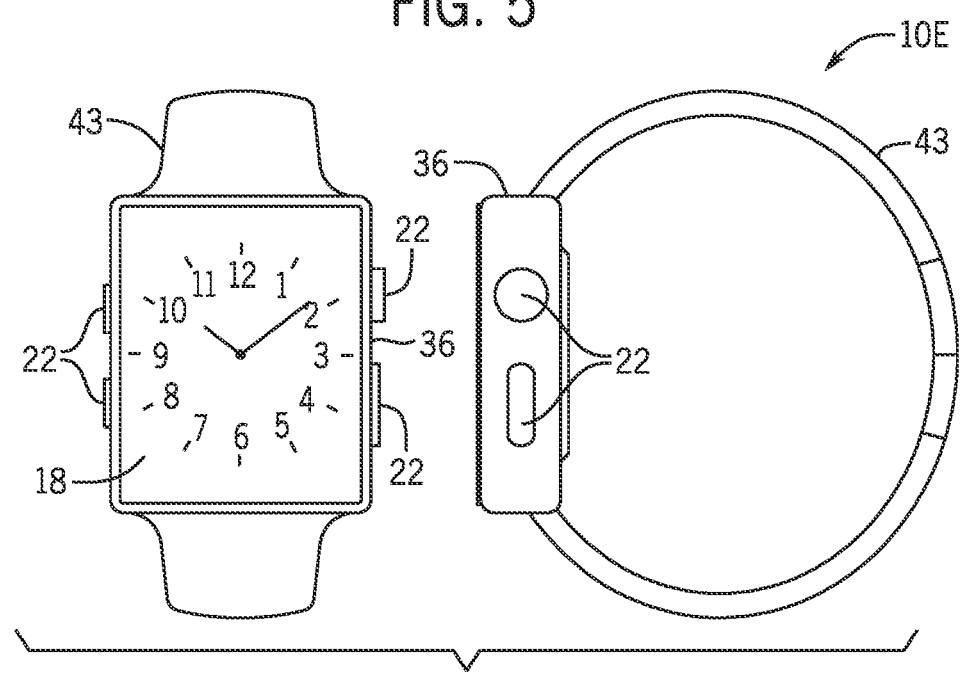
FIG. 6 is a front view and side view of a wearable electronic device representing a fifth embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor 12 and other related items in FIG. 1 may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor 12 may operably couple with the memory 14 and the nonvolatile storage 16 to perform various algorithms. Such programs or instructions executed by the processor 12 may be stored in any suitable article of manufacture that includes one or more tangible, computer-readable media at least collectively storing the instructions or processes, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions executable by the processor 12 to enable the electronic device 10 to provide various functionalities.

In certain embodiments, the display 18 may be a liquid crystal display (LCD), which may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more organic light emitting diode (OLED) displays, or some combination of LCD panels and OLED panels.

A controller 20 may also be inducted in the electronic device 10. The controller 20 may include one or more of the processors 12. In some cases, the controller 20 may operate circuitry to input or output data generated by the electronic device 10. For example, the controller 20 may control and/or operate the memory 14, the storage 16, display 18, input structures 22, an input/output (I/O interface) 24, a network interface 26, a transceiver 28, a power source 29, or the like to perform operations of the electronic device 10 and/or to facilitate control of the operations of the electronic device. In particular, the controller 20 may generate control signals for operating the transceiver 28 to transmit and/or receive data on one or more communication networks.

The input structures 22 of the electronic device 10 may enable a user to interact with the electronic device 10 (e.g., pressing a button to increase or decrease a volume level). The I/O interface 24 may enable the electronic device 10 to interface with various other electronic devices, as may the network interface 26. The network interface 26 may include, for example, one or more interfaces for a personal area network (PAN), such as a BLUETOOTH® network, for a local area network (LAN) or wireless local area network (WLAN), such as an 802.11x WI-FI® network, and/or for a wide area network (WAN), such as a $3^{rd}$ generation (3G) cellular network, 4th generation (4G) cellular network, long term evolution (LTE®) cellular network, long term evolution license assisted access (LTE-LAA) cellular network, 5th generation (5G) cellular network, or New Radio (NR) cellular network. The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

In some embodiments, the electronic device 10 communicates over the aforementioned wireless networks (e.g., WI-FI®, WIMAX®, mobile WIMAX®, 4G, LTE®, 5G, and so forth) using the transceiver 28. The transceiver 28 may include circuitry useful in both wirelessly receiving and wirelessly transmitting signals (e.g., data signals, wireless data signals, wireless carrier signals, RF signals), such as a transmitter and/or a receiver. Indeed, in some embodiments, the transceiver 28 may include a transmitter and a receiver combined into a single unit, or, in other embodiments, the transceiver 28 may include a transmitter separate from a receiver. The transceiver 28 may transmit and/or receive RF signals to support voice and/or data communication in wireless applications such as, for example, PAN networks (e.g., BLUETOOTH®), WLAN networks (e.g., 802.11x WI-FI®), WAN networks (e.g., 3G, 4G, 5G, NR, and LTE® and LTE-LAA cellular networks), WIMAX® networks, mobile WIMAX® networks, ADSL and VDSL networks, DVB-T® and DVB-H® networks, UWB networks, and so forth. As further illustrated, the electronic device 10 may include the power source 30. The power source 30 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may be generally portable (such as laptop, notebook, and tablet computers) and/or those that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. of Cupertino, Calif. By way of example, the electronic device 10, taking the form of a notebook computer 10A, is illustrated in FIG. 2 in accordance with one embodiment of the present disclosure. The notebook computer 10A may include a housing or the enclosure 36, the display 18, the input structures 22, and ports associated with the I/O interface 24. In one embodiment, the input structures 22 (such as a keyboard and/or touchpad) may enable interaction with the notebook computer 10A, such as starting, controlling, or operating a graphical user interface (GUI) and/or applications running on the notebook computer 10A. For example, a keyboard and/or touchpad may facilitate user interaction with a user interface, GUI, and/or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include the enclosure 36 to protect interior elements from physical damage and to shield them from electromagnetic interference. The enclosure 36 may surround the display 18. The I/O interface 24 may open through the enclosure 36 and may include, for example, an I/O port for a hard wired connection for charging and/or content manipulation using a standard connector and protocol, such as the Lightning connector provided by Apple Inc. of Cupertino, Calif., a universal serial bus (USB), or other similar connector and protocol.

The input structures 22, in combination with the display 18, may enable user control of the handheld device 10B. For example, the input structures 22 may activate or deactivate the handheld device 10B, navigate a user interface to a home screen, present a user-editable application screen, and/or activate a voice-recognition feature of the handheld device 10B. Other of the input structures 22 may provide volume control, or may toggle between vibrate and ring modes. The input structures 22 may also include a microphone to obtain a user's voice for various voice-related features, and a speaker to enable audio playback. The input structures 22 may also include a headphone input to enable input from external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. of Cupertino, Calif. It should be noted that the computer 10D may also represent a personal computer (PC) by another manufacturer. The enclosure 36 may protect and enclose internal elements of the computer 10D, such as the display 18. In certain embodiments, a user of the computer 10D may interact with the computer 10D using various peripheral input devices, such as keyboard 22A or mouse 22B (e.g., input structures 22), which may operatively couple to the computer 10D.

Similarly, FIG. 6 depicts a wearable electronic device 10E representing another embodiment of the electronic device 10 of FIG. 1. By way of example, the wearable electronic device 10E, which may include a wristband 43, may be an Apple Watch® by Apple Inc. of Cupertino, Calif. However, in other embodiments, the wearable electronic device 10E may include any wearable electronic device such as, a wearable exercise monitoring device (e.g., pedometer, accelerometer, heart rate monitor), or other device by another manufacturer. The display 18 of the wearable electronic device 10E may include a touch screen version of the display 18 (e.g., LCD, OLED display, active-matrix organic light emitting diode (AMOLED) display, and so forth), as well as the input structures 22, which may facilitate user interaction with a user interface of the wearable electronic device 10E. In certain embodiments, as previously noted above, each embodiment (e.g., notebook computer 10A, handheld device 10B, handheld device 10C, computer 10D, and wearable electronic device 10E) of the electronic device 10 may include the transceiver 28.

Figure 7:
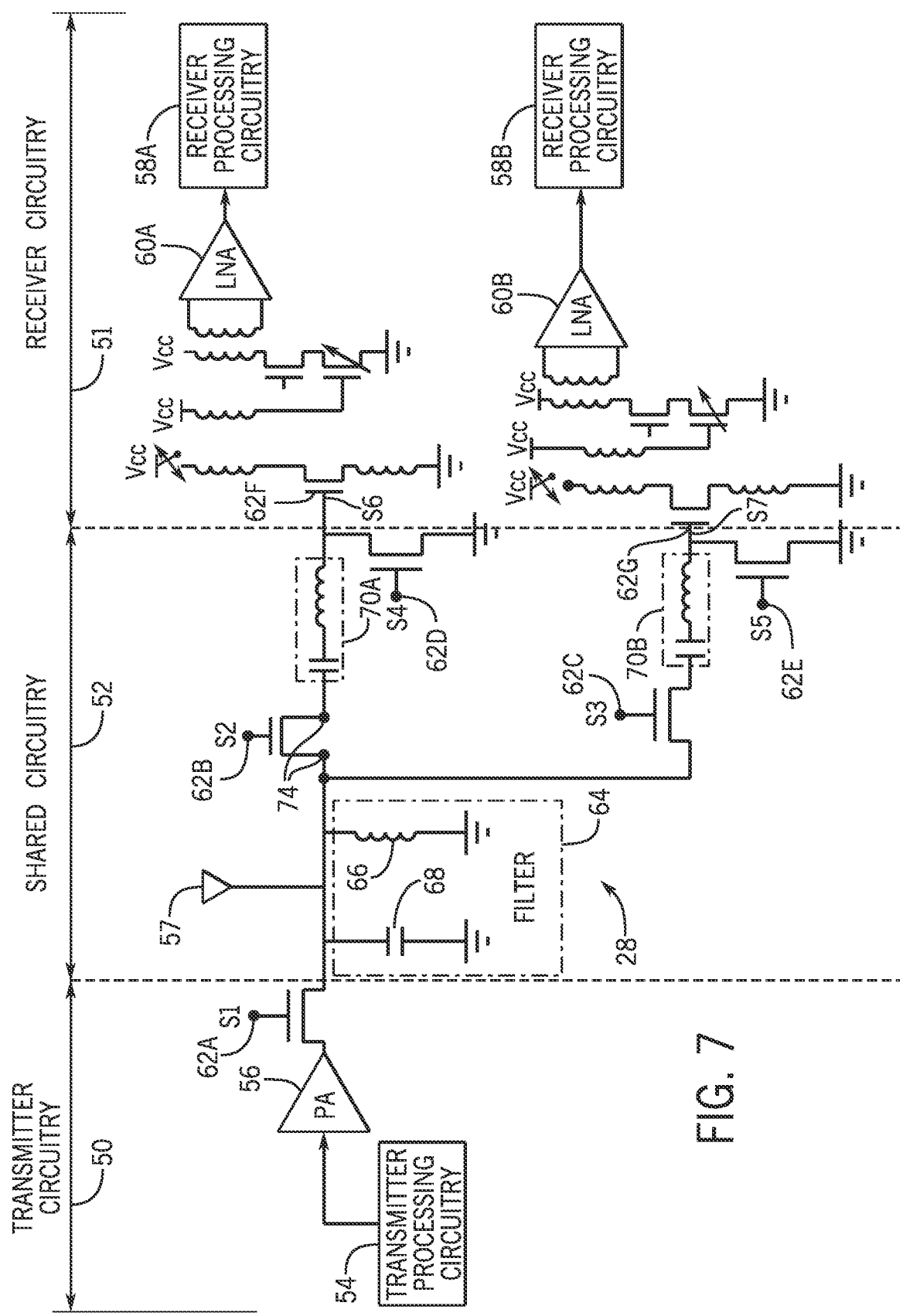
FIG. 7 is a circuit diagram of at least a portion of a transceiver of the electronic device of FIG. 1 including transmitter circuitry, receiver circuitry, and radio frequency filtering circuitry shared by the transmitter and receiver circuitries, in accordance with an embodiment.

Keeping the foregoing in mind, FIG. 7 is a circuit diagram of at least a portion of the transceiver 28 operating to transmit and/or receive radio frequency (RF) signals using transmitter circuitry 50, receiver circuitry 51, and circuitry shared by the transmitter and receiver circuitries 50, 51 (shared circuitry 52), according to embodiments of the present disclosure. The transmitter circuitry 50 may include transmitter processing circuitry 54 that processes transmission signals and sends the processed transmission signals to a power amplifier 56 for amplification prior to transmission via an antenna 57. The receiver circuitry 51 receives signals from the antenna 57 as part of a receive operation and may amplify the received signals using one or more low noise amplifiers (LNAs) 60 (60A, 60B) prior to sending the signals to receiver processing circuitry 58 (58A, 58B) for processing.

The one or more LNAs 60 may increase a magnitude of a signal without increasing noise of the signal. For example, LNAs 60A, 60B may respectively receive a receive signal from the antenna 57, depending on which receive mode the transceiver 28 is using, and increase the magnitude of a signal without increasing noise of the receive signal. Although two LNAs 60 are depicted, it should be understood that any number of LNAs may be implemented in the transceiver 28, such as two, three, four, or more LNAs to amplify any suitable number of frequency bands. In the illustrated embodiment, the LNA 60A may process relatively lower frequencies (e.g., corresponding to a low-band or mid-band low noise amplifier) and the LNA 60B may process relatively higher frequencies (e.g., corresponding to a high-band low noise amplifier). In some embodiments, a controller 20 or other circuitry of the receiver circuitry 51 (not depicted) may regulate power supplied to the LNAs 60A, 60B according to average power tracking of the modified signal or envelope tracking of the signal.

Receive signals output from the LNAs 60A, 60B or other circuitry of the receiver circuitry 51 may be transmitted to the receiver processing circuitry 58 for additional processing, such as by filtering and/or demodulating the signals. The receiver processing circuitry 58 may include any suitable hardware or software to perform a variety of signal-improving or signal-analysis operations on a receive signal from the antenna 57. For example, the receiver processing circuitry 58 may include an analog-to-digital converter, additional filtering circuitry, phase shifting circuitry (e.g., 180 degree phase shifter) or the like.

The shared circuitry 52 may be used by both the transmitter circuitry 50 for transmitting signals and the receiver circuitry 51 for receiving signals. The shared circuitry 52 thus includes the antenna 57, as well as radio circuitry filtering circuitry that may enable pass through of signals of desired frequencies or blocking of signals of undesired frequencies. In particular, the transmitter circuitry 50 may include switching circuitry 62 (e.g., switch 62A) that enables the transmitter circuitry 50 to couple to the antenna 57 to send signals and uncouple from the antenna 57 (e.g., when the receiver circuitry 51 receives signals). Similarly, the receiver circuitry 51 may include switching circuitry 62 (e.g., switch 62F, 62G) that enables the receiver circuitry 51 to couple to the antenna 57 to receive signals and uncouple from the antenna 57 (e.g., when the transmitter circuitry 50 sends signals).

In particular, the power amplifier 56 may be coupled to the antenna 57 through a switch 62A when turned on (e.g., activated to enable current to flow through) via control signal S1. The switch 62A and/or any switching circuitry 62 (e.g., 62B, 62C, 62D, 62E, 62F, 62G) discussed herein may be any suitable transistor or switching device, such as a metal-oxide-semiconductor field-effect transistor (MOSFET), insulated-gate bipolar transistor (IGBT), or the like, and may each be controlled by respective control signals S (e.g., S1, S2, S3, S4, S5). A controller 20 may transmit a control signal (e.g., control signal S2) having a voltage value suitable to cause the terminals of the respective transistors used for the switching circuitry 62 to conduct, thus respectively turning on, or activating, the switching circuitry 62. When a voltage value is unsuitable to cause the terminals to conduct, it may be said that the switching circuitry 62 is deactivated or turned off.

The antenna 57 may also be coupled to a filter 64. The filter 64 may remove (e.g., filter, attenuate to zero amplitude or to a lower amplitude) signals characterized by a frequency lower or higher than a threshold frequency range. In this way, the filter 64 may improve an RF signal quality (e.g., reduce noise, isolate desired frequencies from undesired frequencies). The filter 64 is shown to include an inductor 66 coupled in parallel with a capacitor 68. However, it should be understood that any combination of filtering circuitry and/or attenuation circuitry may be used to pass a desired range of frequencies. For example, any suitable filter or attenuation circuitry may be used in place of or in addition to the filter 64, and the filter 64 may be considered a high pass filter, a bandpass filter, or the like. The shared circuitry 52 may also include additional radio frequency filtering circuitry (e.g., filters 70A, 70B) that may individually filter signals of different radio frequency bands, and, when joined in combination, filter signals of additional radio frequency bands.

For example, the filter 64 may be used alone to pass transmit or receive signals within a first frequency range (e.g., between 24 Gigahertz (GHz) and 33 GHz) and block signals outside of the first frequency range. When the filter 64 is combined with a filter 70A, such as through at least the switch 62B, the combination of filtering circuitry may be used to pass transmit or receive signals within a second frequency range (e.g., between 37 GHz and 43 GHz) and block signals outside of the second frequency range. Furthermore, when the filter 64 is combined with the filter 70A and a filter 70B, such as through the switches 62B and 62C, the combination of filtering circuitry may be used to pass transmit or receive signals within a third frequency range (e.g., 48 GHz, between 47 GHz and 49 GHz) and block signals outside of the third frequency range.

By sharing filtering circuitry (e.g., filters, circuitry characterized by an impedance) between transmit operations and receive operations (e.g., by toggling on and off switches 62A, 62F, 62G to couple the transmitter circuitry 50 or the receiver circuitry 51 to the shared circuitry 52), and selecting different filters 64, 70A, 70B (e.g., by toggling on and off switches 62B, 62C, 62D, 62E) based on desired filtering frequencies, the transceiver 28 may communicate with signals having a relatively wide variety of frequencies. These ranges, for example, may include frequencies within a threshold range of these frequencies, such as within 1 GHz, 500 Megahertz (MHz), 100 MHz, 10 MHz, 100 Hertz (Hz), and so on. It is noted that in this disclosure, three filtering circuits are used to enable the transceiver 28 to process three different frequency ranges. However, it should be understood that different filters, a different number of filters, and/or different impedances may be used to enable the transceiver 28 to process different frequency ranges (e.g., frequency ranges of different frequencies, a different number of frequency ranges).

Figure 8:
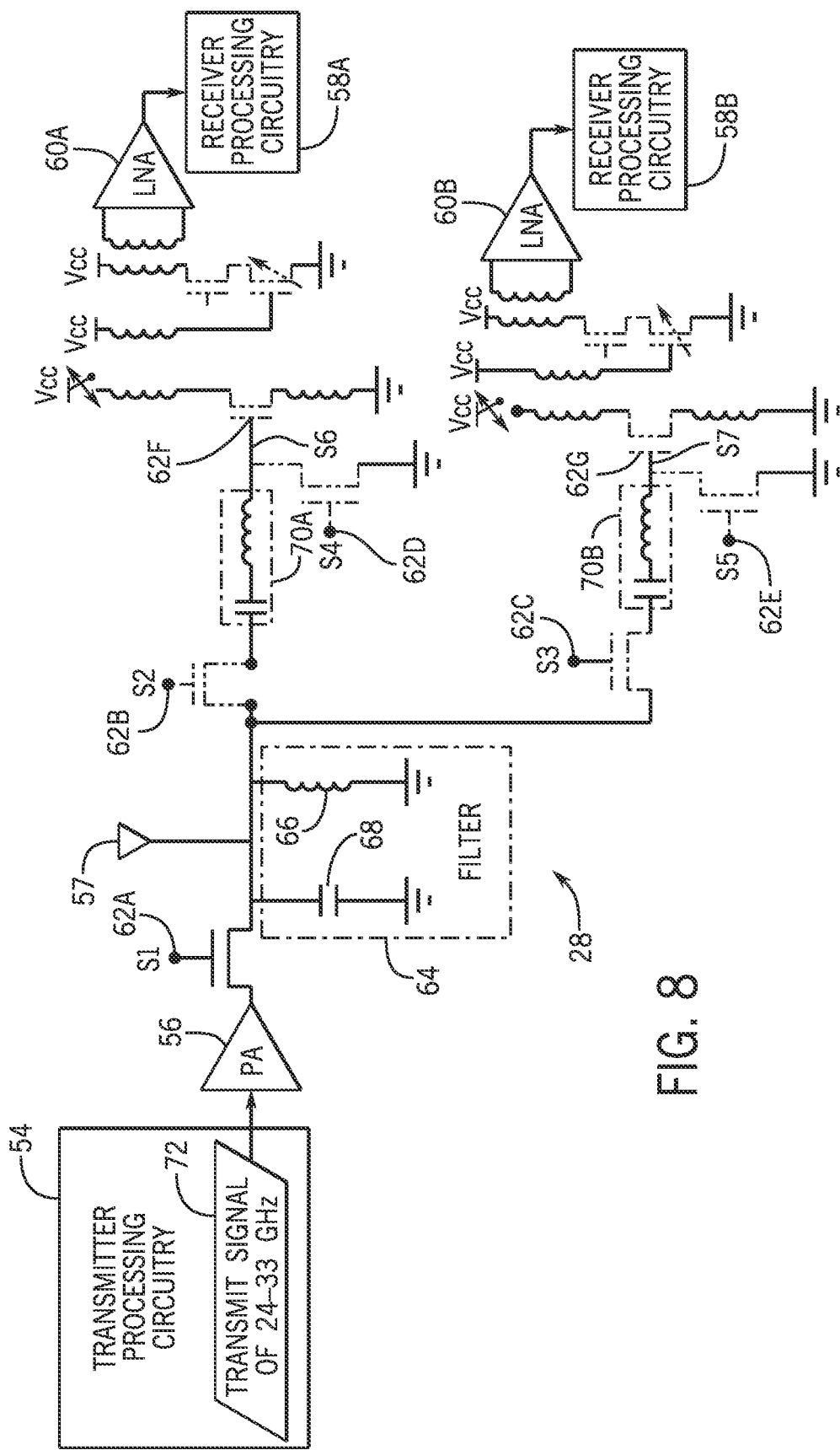
FIG. 8 is a circuit diagram of the transceiver of FIG. 7 operating to transmit radio frequency (RF) signals having a first frequency range (e.g., approximately between 24 Gigahertz (GHz) and 33 GHz), in accordance with an embodiment.
Figure 14:
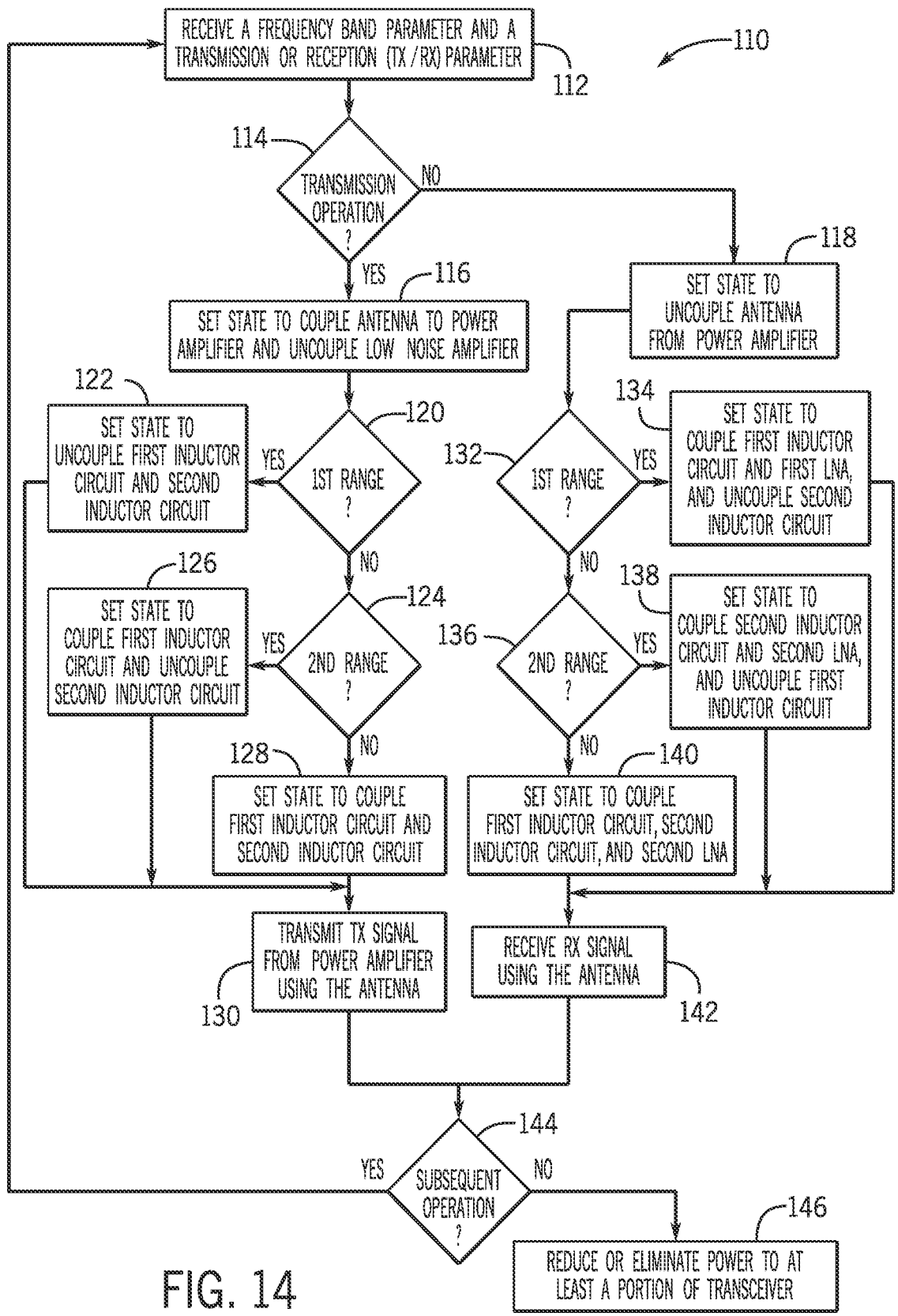
FIG. 14 is a flowchart illustrating a method for operating the electronic device of FIG. 1 to transmit and/or receive RF signals having a frequency range approximately between 24 GHz and 33 GHz, a frequency range approximately between 37 GHz and 43 GHz, and/or a frequency of approximately 48 GHz, in accordance with an embodiment.

To help elaborate on the transmit operations, FIG. 8 is a circuit diagram of the transceiver 28 of FIG. 7 operating in the first transmit mode to transmit signals (e.g., transmit signal 72) having a first frequency range (e.g., approximately between 24 GHz and 33 GHz), according to embodiments of the present disclosure and corresponding to operations of at least block 122 of FIG. 14. It is noted, as used in the figures, when a switch is represented with a solid line, the switch is on or closed (e.g., able to conduct), and when a switch is represented with a dashed line, the switch is off or open (e.g., not conducting). The signals described above may be processed by the transceiver 28. While in the first transmit mode, the transceiver 28 may process signals having frequencies in the first frequency range.

In particular, the filter 64 may enable frequencies of the transmit signal 72 within the first frequency range to pass through, while block frequencies of the transmit signal 72 that are outside the first frequency range. To do so, a controller 20 of the processors 12 may turn on the switch 62A to couple the transmitter circuitry 50, via the power amplifier 56, to the filter 64 and the antenna 57. The controller 20 may also turn off the switch 62B to uncouple the filter 70A, the LNA 60A, and the receiver processing circuitry 58A from the antenna 57. As such, the transmit signal 72 may not be filtered by the filter 70A, and may be isolated from the LNA 60A and the receiver processing circuitry 58A. Similarly, the controller 20 may additionally turn off the switch 62C to uncouple the filter 70B, the LNA 60B, and the receiver processing circuitry 58B from the antenna 57. As such, the transmit signal 72 may not be filtered by the filter 70B, and may be isolated from the LNA 60B and the receiver processing circuitry 58B. Furthermore, the controller 20 may operate the switch 62D off, the switch 62E off, the switch 62F off, and the switch 62G off.

When the switches operate in this configuration, the transceiver 28 uses the filter 64 to process the transmit signal 72 output from the transmitter processing circuitry 54 for transmission, but does not use the filter 70A and the filter 70B. Moreover, the transmit signal 72 is isolated from the receiver circuitry 51. To filter frequencies from the transmit signal 72 different than the first frequency band, instead of using a completely different filter or set of filters than the filter 64, an additional filter (e.g., the filter 70A) may be combined with the filter 64. This is shown in FIG. 9.

Figure 9:
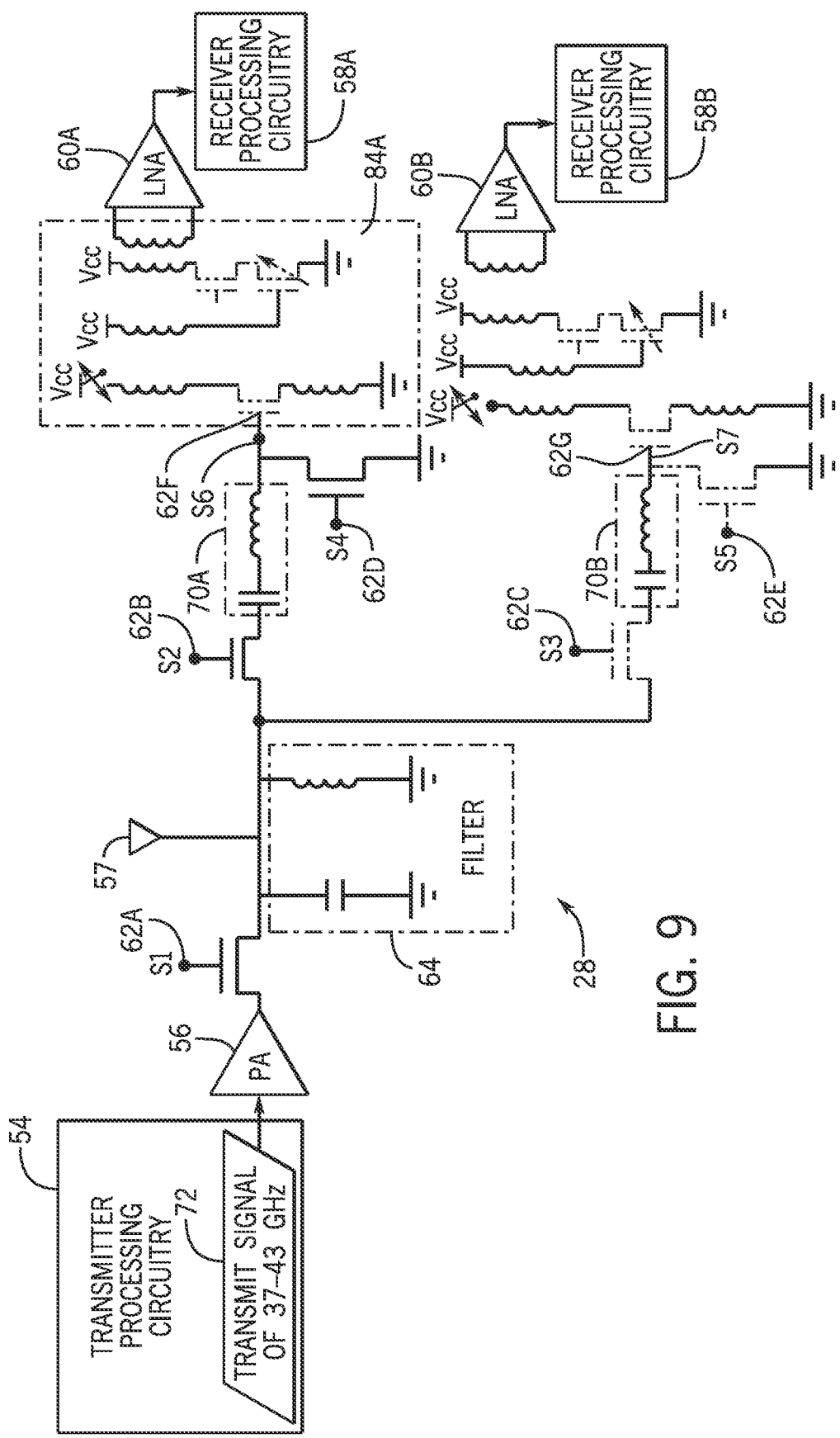
FIG. 9 is a circuit diagram of the transceiver of FIG. 7 operating to transmit RF signals having a second frequency range (e.g., approximately between 37 GHz and 43 GHz), in accordance with an embodiment.

FIG. 9 is a circuit diagram of the transceiver 28 of FIG. 7 operating in the second transmit mode to transmit signals (e.g., transmit signal 72) having a second frequency range (e.g., approximately between 37 GHz and 43 GHz), according to embodiments of the present disclosure and corresponding to operations of at least block 126 of FIG. 14. The combination of the filter 64 and the filter 70A may enable frequencies of the transmit signal 72 within the second frequency range to pass through to the antenna 57, while blocking frequencies of the transmit signal 72 that are outside the second frequency range from passing through.

To do so, the controller 20 of the processors 12 may turn on the switch 62A to couple the transmitter circuitry 50, via the power amplifier 56, to the filter 64 and the antenna 57.

The controller 20 may also turn on the switch 62B and the switch 62D to couple the filter 70A to the filter 64, the antenna 57, and the power amplifier 56. However, the controller 20 may turn off the switch 62F to decouple the LNA 60A and the receiver processing circuitry 58A from the antenna 57. As such, the transmit signal 72 may be filtered by the filter 70A in combination with the filter 64, and may be isolated from the LNA 60A and the receiver processing circuitry 58A. The controller 20 may additionally turn off the switch 62C to uncouple the filter 70B, the LNA 60B, and the receiver processing circuitry 58B from the antenna 57. As such, the transmit signal 72 may not be filtered by the filter 70B, and may be isolated from the LNA 60B and the receiver processing circuitry 58B. Furthermore, the controller 20 may operate the switch 62E off, the switch 62F off, and the switch 62G off.

When the switches operate in this configuration, the transceiver 28 uses the filter 64 and the filter 70A to process the transmit signal 72 output from the transmitter processing circuitry 54 for transmission, but does not use the filter 70B. Moreover, the transmit signal 72 is isolated from the receiver circuitry 51. To filter frequencies from the transmit signal 72 different than the first and second frequency bands, instead of using a completely different filter or set of filters than the filter 64, an additional filter (e.g., the filter 70B) may be combined with the filter 64 and the filter 70A. This is shown in FIG. 10.

Figure 10:
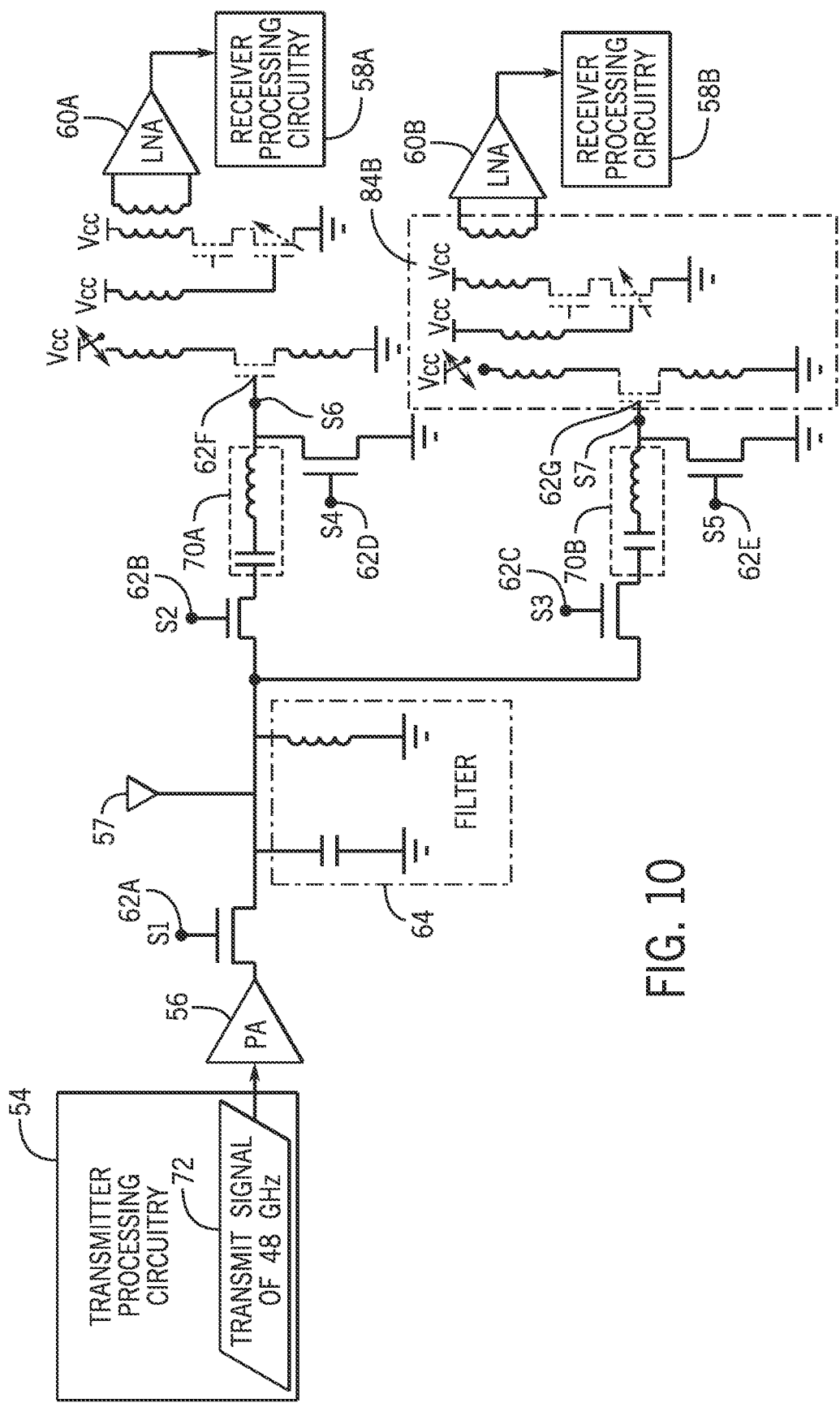
FIG. 10 is a circuit diagram of at least a portion of the transceiver of FIG. 7 operating to transmit RF signals having a third frequency of (e.g., approximately 48 GHz), in accordance with an embodiment.

FIG. 10 is a circuit diagram of the transceiver 28 of FIG. 7 operating in the third transmit mode to transmit signals (e.g., transmit signal 72) having a third frequency range (e.g., approximately 48 GHz, between approximately 47 GHz and 49 GHz), according to embodiments of the present disclosure and corresponding to operations of at least block 128 of FIG. 14. The combination of the filter 64, the filter 70A, and the filter 70B may enable frequencies of the transmit signal 72 within the third frequency range to pass through, while blocking frequencies of the transmit signal 72 that are outside the second frequency range from passing through to the antenna 57.

To do so, a controller 20 of the processors 12 may turn on the switch 62A to couple the transmitter circuitry 50, via the power amplifier 56, to the filter 64 and the antenna 57. The controller 20 may turn on the switch 62B and the switch 62D to couple the filter 70A to the filter 64, the antenna 57, and the power amplifier 56. The controller 20 may also turn on the switch 62C and the switch 62E to couple the filter 70B to the filter 64, the filter 70A, the antenna 57, and the power amplifier 56. However, the controller 20 may turn off the switch 62F to decouple the LNA 60A and the receiver processing circuitry 58A from the antenna 57 and may turn off the switch 62G to decouple the LNA 60B and the receiver processing circuitry 58B from the antenna 57. As such, the transmit signal 72 may be filtered by the filter 70A and the filter 70B, and may be isolated from the LNA 60A, the LNA 60B, the receiver processing circuitry 58A, and the receiver processing circuitry 58B.

When the switches operate in this configuration, the transceiver 28 uses the filter 64, the filter 70A, and the filter 70B to process the transmit signal 72 transmitted from the transmitter processing circuitry 54 for transmission. Moreover, the transmit signal 72 is isolated from the receiver circuitry 51. To filter frequencies of signals received instead of transmit signals (e.g., transmit signal 72), instead of using a completely different filter or set of filters than the filter 64, the filter 70A may be combined with the filter 64. This is shown in FIG. 11.

To elaborate, the transceiver 28 may be operated to transmit the transmit signal 72 after amplification via power amplifier 56. In some cases, however, the transceiver 28 may be used to receive one or more RF signals. Advantageously, the same filters 64, 70A, 70B of the shared circuitry 52 used by the transmitter circuitry 50 may be reused by the receiver circuitry 51 to filter the same or similar frequency bands. In this manner, space reserved for receiver filtering circuitry separate from transmitter filtering circuitry may be reclaimed or used for additional components in the electronic device 10.

Figure 11:
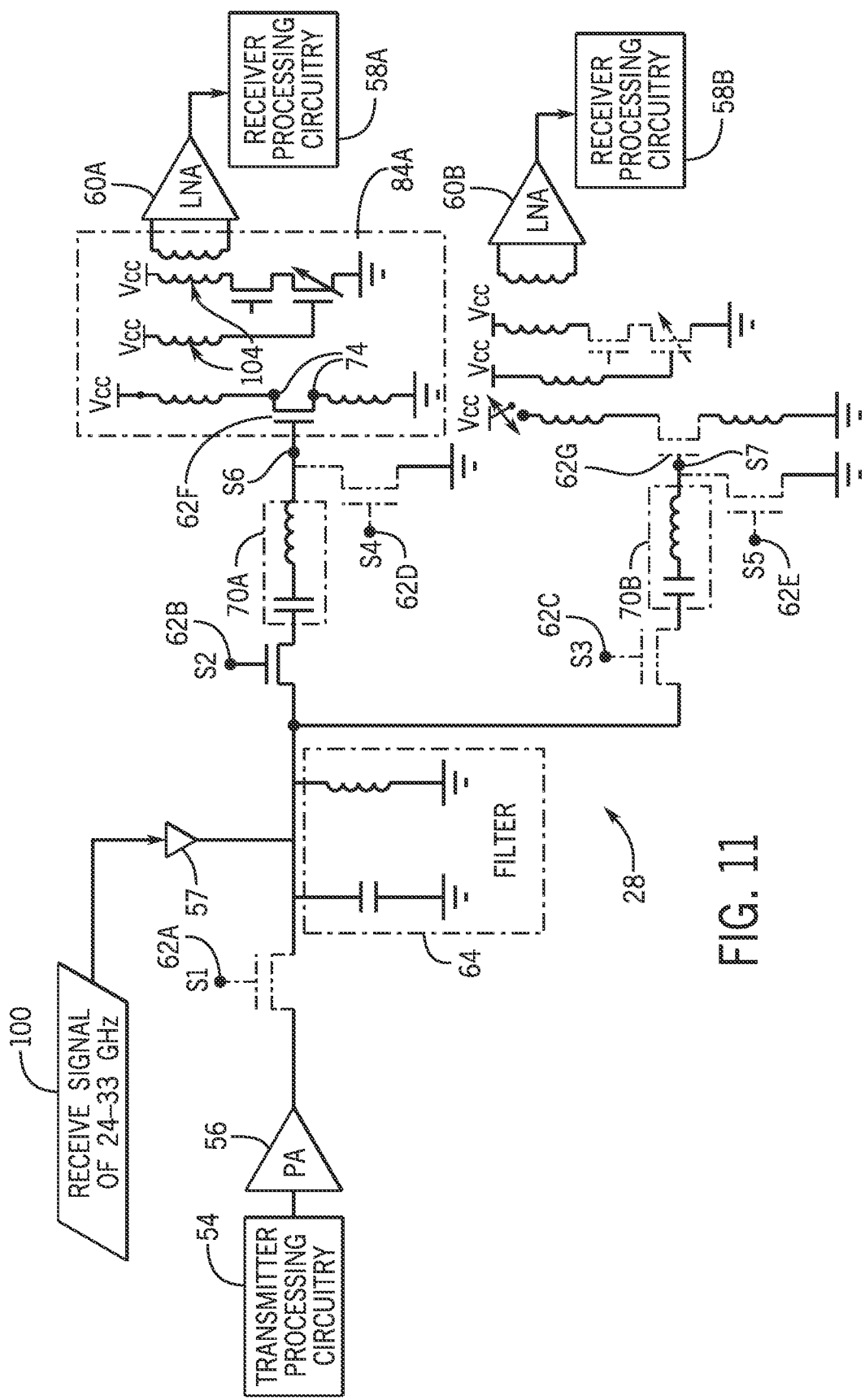
FIG. 11 is a circuit diagram of at least a portion of the transceiver of FIG. 7 operating to receive RF signals having the first frequency range (e.g., approximately between 24 GHz and 33 GHz), in accordance with an embodiment.

For example, FIG. 11 is a circuit diagram of the transceiver 28 in a first receive mode, according to embodiments of the present disclosure and corresponding to operations of at least block 134 of FIG. 14. The combination of the filter 64 and the filter 70A may enable frequencies of a receive signal 100 within the first frequency range (e.g., between 24 GHz and 33 GHz) to pass through to the receiver processing circuitry 58A, while blocking frequencies of the receive signal 100 that are outside the first frequency range from passing through.

To do so, the controller 20 of the processors 12 may turn off the switch 62A to decouple the transmitter circuitry 50, via the power amplifier 56, from the filter 64 and the antenna 57. The controller 20 may turn on the switch 62B and may turn off the switch 62D to couple the filter 70A to the filter 64, the antenna 57, and the LNA 60A. However, the controller 20 may turn off the switch 62C and the switch 62E to decouple the filter 70B from the antenna 57. The controller 20 may turn off the switch 62G to decouple the LNA 60B and the receiver processing circuitry 58B from the antenna 57. As such, the receive signal 100 may be filtered by the filter 70A in combination with the filter 64 without being filtered by the filter 70B, and may be isolated from the LNA 60B and the receiver processing circuitry 58B.

Figure 12:
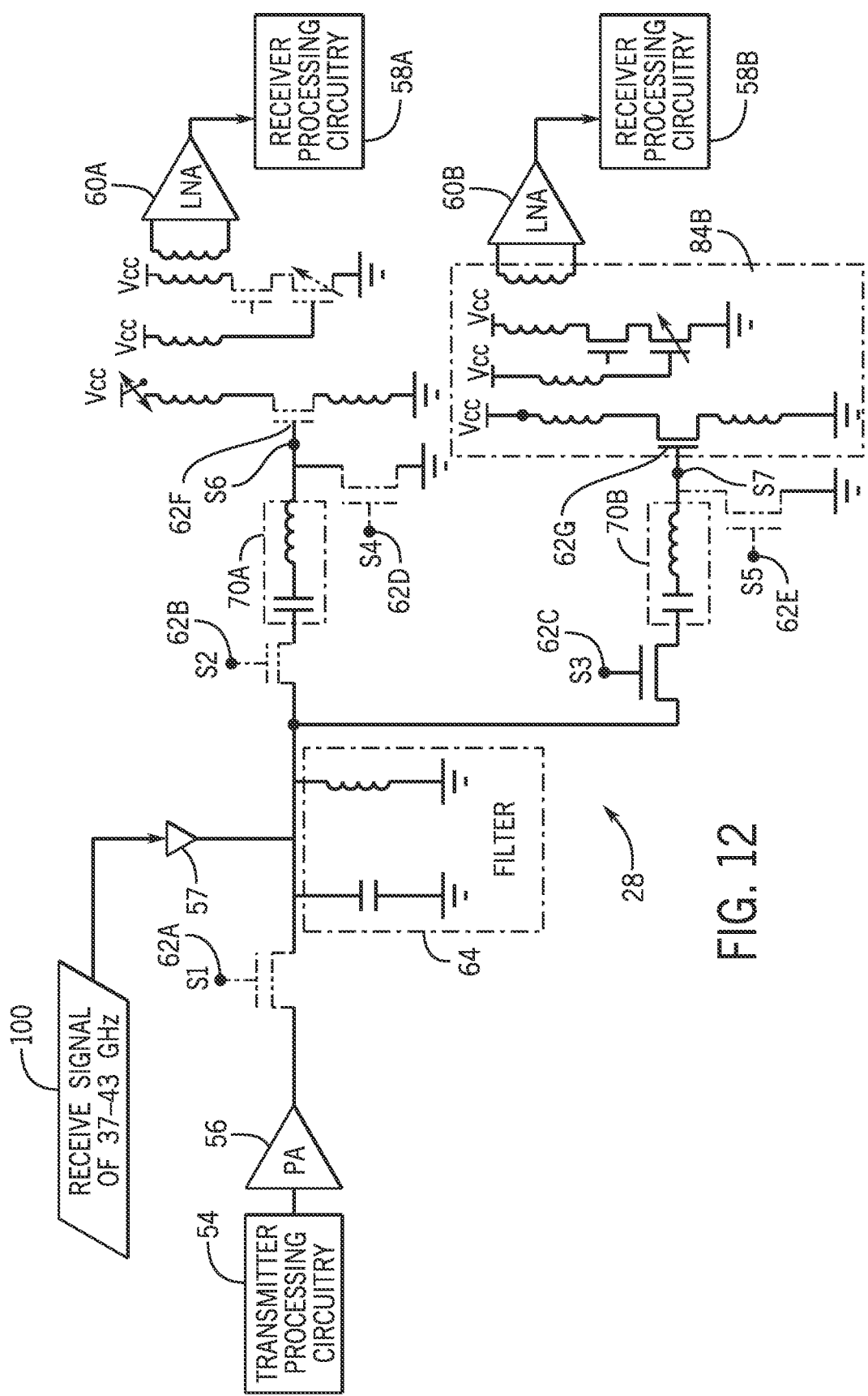
FIG. 12 is a circuit diagram of at least a portion of the transceiver of FIG. 7 operating to receive RF signals having the second frequency range (e.g., approximately between 37 GHz and 43 GHz), in accordance with an embodiment.

When the switches operate in this configuration, the transceiver 28 uses the filter 64 and the filter 70A to process the receive signal 100 received at the antenna 57, but does not use the filter 70B. Moreover, the receive signal 100 is isolated from the transmitter circuitry 50. To filter frequencies from the receive signal 100 different than the first frequency band, instead of using a completely different filter or set of filters than the filter 64, an additional filter (e.g., the filter 70B) may be combined with the filter 64 instead of the filter 70A. This is shown in FIG. 12.

The controller 20 may also be able to operate the transceiver 28 in a second receive mode to receive the receive signal 100 using the second frequency range. For example, FIG. 12 is a circuit diagram of the transceiver 28 in the second receive mode, according to embodiments of the present disclosure and corresponding to operations of at least block 138 of FIG. 14. The combination of the filter 64 and the filter 70A may enable frequencies of a receive signal 100 within the second frequency range (e.g., between 37 GHz and 43 GHz) to pass through to the receiver processing circuitry 58B, while blocking frequencies of the receive signal 100 that are outside the second frequency range from passing through.

To do so, the controller 20 of the processors 12 may turn off the switch 62A to decouple the transmitter circuitry 50, via the power amplifier 56, from the filter 64 and the antenna 57. The controller 20 may turn on the switch 62C and may turn off the switch 62E to couple the filter 70B to the filter 64, the antenna 57, and the LNA 60B. The controller 20 may turn off the switch 62B and the switch 62D to decouple the filter 70A from the antenna 57. The controller 20 may turn off the switch 62F to decouple the LNA 60A and the receiver processing circuitry 58A from the antenna 57. As such, the receive signal 100 may be filtered by the filter 70B in combination with the filter 64 without being filtered by the filter 70A, and may be isolated from the LNA 60A and the receiver processing circuitry 58A.

When the switches operate in this configuration, the transceiver 28 uses the filter 64 and the filter 70B to process the receive signal 100 received at the antenna 57, but does not use the filter 70A. Moreover, the receive signal 100 is isolated from the transmitter circuitry 50. To filter frequencies from the receive signal 100 different than the first or second frequency bands, instead of using a completely different filter or set of filters than the filter 64, the filter 70B may be combined with the filter 64 and the filter 70A. This is shown in FIG. 13.

Figure 13:
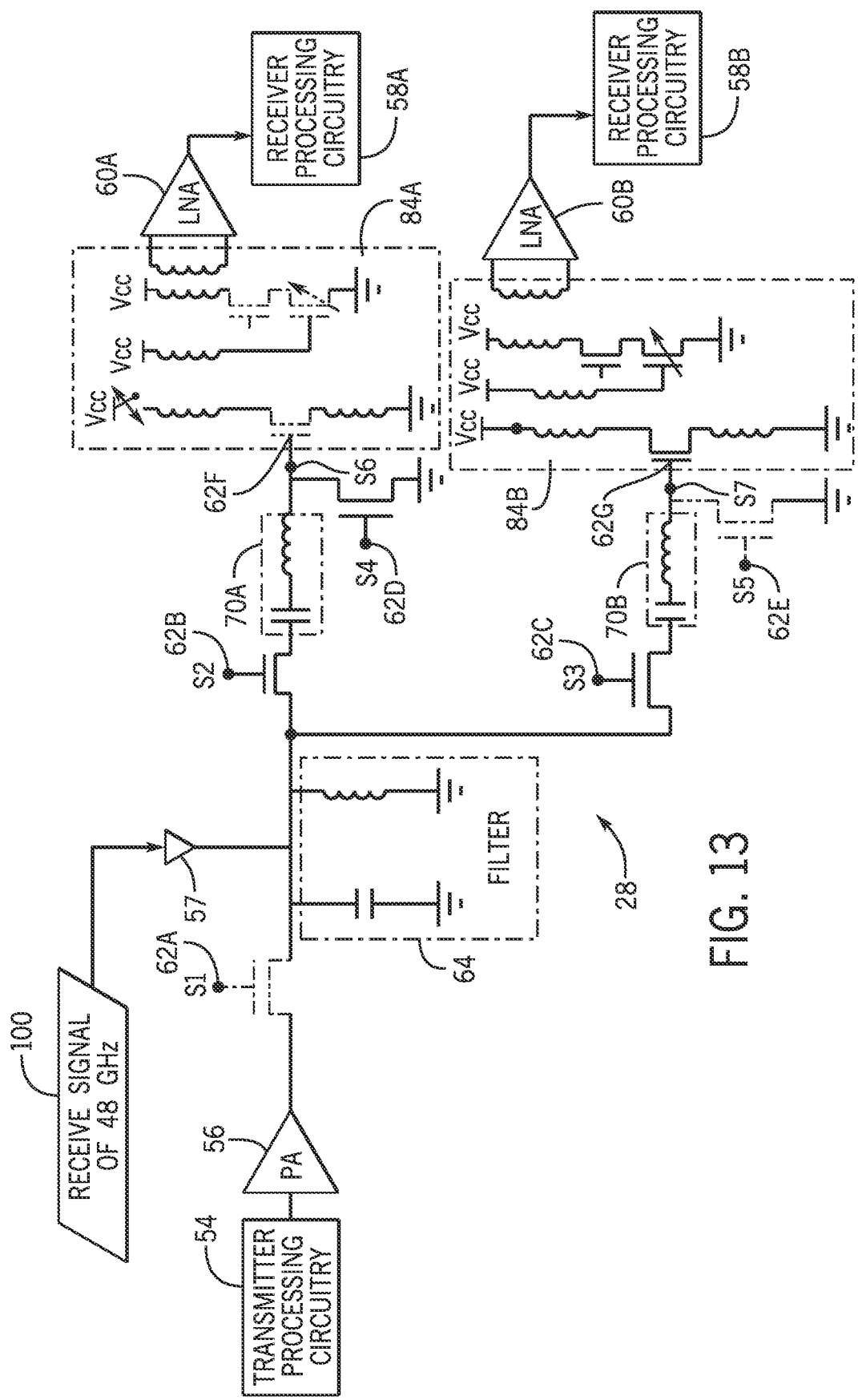
FIG. 13 is a circuit diagram of the transceiver of FIG. 7 operating to receive RF signals having the third frequency (e.g., approximately 48 GHz), in accordance with an embodiment.

FIG. 13 is a circuit diagram of the transceiver 28 in a third receive mode, according to embodiments of the present disclosure and corresponding to operations of at least block 140 of FIG. 14. The combination of the filter 64, the filter 70A, and the filter 70B may enable frequencies of a receive signal 100 within the third frequency range (e.g., approximately 48 GHz, between approximately 47 GHz and 49 GHz) to pass through to the receiver processing circuitry 58B, while blocking frequencies of the receive signal 100 that are outside the third frequency range.

To do so, the controller 20 of the processors 12 may turn off the switch 62A to decouple the transmitter circuitry 50, via the power amplifier 56, from the filter 64 and the antenna 57. The controller 20 may turn on the switch 62C and may turn off the switch 62E to couple the filter 70B to the filter 64, the antenna 57, and the LNA 60B. The controller 20 may turn on the switch 62B and the switch 62D to couple the filter 70A to the antenna 57, the filter 64, and the filter 70B. The controller 20 may turn off the switch 62F to decouple the LNA 60A and the receiver processing circuitry 58A from the antenna 57. As such, the receive signal 100 may be filtered by the filter 70B in combination with the filter 64 and the filter 70A, and may be isolated from the LNA 60A and the receiver processing circuitry 58A.

When the switches operate in this configuration, the transceiver 28 uses the filter 64, the filter 70A, and the filter 70B to process the receive signal 100 received at the antenna 57. Moreover, the receive signal 100 is isolated from the transmitter circuitry 50. For ease of description, the various operational modes of the transceiver 28 may be summarized in Table 1 below. It is noted that Table 1 outlines relative states of the certain switching circuitry 62, and how the combination of operation of the switching circuitry 62 corresponds to the various operational modes of the transceiver 28, where switch 62A corresponds to S1, the switch 62B corresponds to S2, the switch 62C corresponds to S3, the switch 62D corresponds to S4, the switch 62E corresponds to S5, the switch 62F corresponds to S6, and the switch 62G corresponds to S7. In some cases, Table 1 also outlines the states of the control signals (e.g., control signals S1, S2, S3, S4, S5, S6, S7) supplied to the switching circuitry 62. As illustrated, a control signal S that is a logic high "ON" signal activates (e.g., turns on) the corresponding switching circuitry 62 to close a circuit, while a control signal S that is a logic low "OFF" signal deactivates (e.g., turns off) the corresponding switching circuitry 62 to open a circuit.

TABLE 1

| Operational Mode of Transceiver 28 | S1 | S2 | S3 | S4 | S5 | S6 | S7 |
|---|---|---|---|---|---|---|---|
| First transmit mode (e.g., FIG. 8) | ON | OFF | OFF | OFF | OFF | OFF | OFF |
| Second transmit mode (e.g., FIG. 9) | ON | ON | OFF | ON | OFF | OFF | OFF |
| Third transmit mode (e.g., FIG. 10) | ON | ON | ON | ON | ON | OFF | OFF |
| First receive mode (e.g., FIG. 11) | OFF | ON | OFF | OFF | OFF | ON | OFF |
| Second receive mode (e.g., FIG. 12) | OFF | OFF | ON | OFF | OFF | OFF | ON |
| Third receive mode (e.g., FIG. 13) | OFF | ON | ON | ON | OFF | OFF | ON |

To clarify further on the operation of the transceiver 28, FIG. 14 is a flowchart of a method 110 for operating the electronic device 10 to transmit and/or receive RF signals using a frequency range (e.g., between approximately 24 GHz and 33 GHz), a second frequency range (e.g., between approximately 37 GHz and 43 GHz), and/or a third frequency range (e.g., between approximately 47 GHz and 49 GHz, approximately 48 GHz), according to embodiments of the present disclosure. It is noted that, although depicted in a particular order, the blocks of the method 110 may be performed in any suitable order. As described herein, the method 110 is described as performed by the controller 20, however, it should be understood that any suitable processing and/or control circuitry may perform some or all of the operations of the method 110, such as one or more of the processors 12.

At block 112, the controller 20 may receive a frequency band parameter and a transmission or reception (TX/RX) parameter. These parameters may be received in same or different data packets. In some cases, the controller 20 may receive the frequency band parameter and/or the TX/RX parameter by reading a status of a register, such as a configuration register, or other suitable types of memory or storage elements of the electronic device 10. The frequency band parameter may indicate which frequency range a portion of the transceiver 28 is to be programmed to use. The TX/RX parameter may indicate whether the portion of the transceiver 28 is to be programmed to transmit and/or to receive signals. It is noted that in some embodiments, the frequency band parameter may expressly indicate the first frequency range or the second frequency range. Absent of either indication, the controller 20 may default to controlling the transceiver 28 to operate using the third frequency range. In some cases, the controller 20 may default to one of the other frequency ranges and/or to one of the other operational modes.

After receiving and/or accessing the frequency band parameter and/or the TX/RX parameter, the controller 20 may, at block 114, determine whether the TX/RX parameter indicates a transmission operation or a reception operation. The controller 20 may interpret a state or status of the TX/RX parameter to determine whether the parameter indicates a transmission operation or a reception operation.

When the TX/RX parameter indicates that the current operation is associated with a transmission (TX) operation, the controller 20 may, at block 116, set a control signal state of the switch 62A to couple the antenna 57 and the filter 64 to the power amplifier 56. At block 120, the controller 20 may determine whether the frequency band parameter indicates the first frequency range. When the frequency band parameter indicates the first frequency range, the controller 20 may, at block 122, set a control signal state of the switch 62B to uncouple the filter 70A from the antenna 57 and the filter 64 and may set a control signal state of the switch 62C to uncouple the filter 70B from the antenna 57 and the filter 64 using the switch 62C.

When the frequency band parameter does not indicate the first frequency range, the controller 20 may, at block 124, determine whether the frequency band parameter indicates the second frequency range. When the frequency band parameter indicates the second frequency range, the controller 20 may, at block 126, set control signal states of the switch 62B and of the switch 62D to couple the filter 70A to the antenna 57 and the filter 64 and may set a control signal state of the switch 62C to uncouple the filter 70B from the antenna 57 and the filter 64. In some embodiments, when the frequency band parameter indicates the second frequency range, the controller 20 may set a control signal state of the switch 62D to isolate the LNA 60A from the antenna 57 and the filter 64. The controller 20 may also set control signal states of the switch 62F and the switch 62G to off to uncouple the LNAs 60A, 60B from the antenna 57 and the filter 64.

When the frequency band parameter does not indicate the first frequency range or the second frequency range, the controller 20 may, at block 128, default to operating in the third transmit mode, and thus may set control signal states of the switch 62B and the switch 62D to couple the filter 70A to the antenna 57 and the filter 64, and may set control signal states of the switch 62C and the switch 62E to couple the filter 70B to the antenna 57 and the filter 64. The controller 20 may set a control signal state of the switch 62F to uncouple the LNA 60A from the antenna 57 during the third transmit mode and may set a control signal state of the switch 62G to uncouple the LNA 60B from the antenna 57 during the third transmit mode.

After the various filters 70 are coupled or uncoupled to the antenna 57 and/or the filter 64 according to the blocks discussed above, at block 130, the transmit signal 72 may be transmitted from the power amplifier 56 to the antenna 57. The controller 20 may initiate the transmission of the transmit signal 72, and/or the transmission of the transmit signal 72 may occur automatically with consideration for time for configuration of the transceiver 28.

Referring back to block 114, when the TX/RX parameter indicates a reception operation, the controller 20 may, at block 118, may set a control signal state of the switch 62A to uncouple the power amplifier 56 from the antenna 57 and from the filter 64. After, before, or while setting the control signal state to uncouple the power amplifier 56, the controller 20 may, at block 132, determine whether the frequency band parameter indicates the first frequency range. When the frequency band parameter indicates the first frequency range, the controller 20 may, at block 134, set control signal states of the switch 62B and the switch 62F to couple the filter 70A to the antenna 57 and the filter 64. The controller 20 may also set a control signal state of the switch 62C to uncouple the filter 70B, and thus the LNA 60B, from the antenna 57 and the filter 64 and set a control signal state of the switch 62D to permit signals to transmit through to the LNA 60A.

When the frequency band parameter does not indicate the first frequency range, the controller 20 may, at block 136, determine whether the frequency band parameter indicates the second frequency range. When the frequency band parameter indicates the second frequency range, the controller 20 may, at block 138, set a control signal state of the switch 62C to couple the filter 70B and the LNA 60B to the antenna 57 and the filter 64. The controller 20 may set a control signal state of the switch 62E to permit the receive signal 100 to transmit from the antenna 57 to the LNA 60A. The controller 20 may also set control signal states of the switch 62B and the switch 62D to uncouple the filter 70A and the LNA 60A from the antenna 57 and the filter 64.

When the frequency band parameter does not indicates the first frequency range and the second frequency range, the controller 20 may, at block 140, default to using the third frequency range and may set control signal states of the switch 62B and the switch 62D to couple the filter 70A to the antenna 57 and the filter 64 without also coupling the LNA 60A to the antenna 57 and filter 64. The controller 20 also sets control signal states of the switch 62C and the switch 62E to couple the filter 70B and the LNA 60B by activating the switch 62C to the antenna 57 and/or the high pass filter 64 without activating the switch 62E.

After the various filters 70 are coupled or uncoupled to the antenna 57 and/or the high pass filter 64 according to the blocks discussed above, the controller 20 may, at block 142, receive the receive signal 100 via the antenna 57.

Once the transceiver 28 receives the receive signal 100 or transmits the transmit signal 72, the controller 20 may, at block 144, determine whether a subsequent communication operation is to be performed. To do so, the controller 20 may, for example, refer to a communication configuration defining transmission and/or reception patterns of the electronic device 10. In some cases, the controller 20 may read a status register able to indicate whether a subsequent communication operation is to occur. If, at block 144, the controller 20 determines that a subsequent communication operation is to occur, the controller 20 may repeat performance of the method 110, such as by returning to block 112.

However, in some cases, if the controller 20 determine that no subsequent operation is to be performed at that time, at block 146, the controller 20 may reduce (e.g., power gate) or eliminate (e.g., remove) power supplied to at least a portion of the transceiver 28, such as the power amplifier 56, and/or may other halt communication operations. To do so, power supplied to the portions of the electronic device 10 (e.g., power supplied to the transceiver 28) may be reduced or removed entirely between communication operations. In this manner, the method 110 may enable the electronic device 10 to send or receive signals at different frequency bands by sharing and reusing radio frequency filters 64, 70A, 70B. As a result, the number of radio frequency filters in the electronic device 10 may be significantly reduced, resulting in a smaller electronic device overall and/or enabling additional components to be included in the electronic device 10. Moreover, the method 110 and electronic devices 10 described herein may be suitable for transmitting and receiving signals of a variety of wavelengths (e.g., relatively narrow wavelengths, middle wavelengths, wide wavelengths, ultrawide wavelengths), and, as such, not suffer from the deficiencies of quarter-wavelength signal paths.

It is noted that, referring back to FIG. 9 as an example, turning on the switch 62D may also redirect leakage currents to ground (e.g., reference voltage) that may otherwise transmit to the receiver processing circuitry 58A when combining the filter 70A with the filter 64. Similarly, turning on the switch 62E may redirect leakage currents to the ground as opposed to the leakage current transmitting through to the receiver processing circuitry 58B during a transmit operation.

Technical effects of the present disclosure include systems and methods for operating transceiver circuitry to transmit and/or receive signals on various frequency ranges by sharing and reusing radio frequency filters. In particular, a transmitter or a receiver of the transceiver circuitry may be selectively coupled to or uncoupled from an antenna of the transceiver circuitry. Additionally, radio frequency filters may be individually or collectively coupled and/or uncoupled to the antenna to filter different frequencies in the transmitting or receiving signals.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
one or more antennas;
transmission circuitry;
receiver circuitry;
a first filter communicatively coupled to the one or more antennas;
a second filter communicatively coupled to the receiver circuitry;
a first switch configured to couple the transmission circuitry to the first filter and the one or more antennas; and
a second switch configured to couple the first filter and the one or more antennas to the second filter and the receiver circuitry.

2. The device of claim 1, comprising a controller configured to transmit a transmit signal on a first frequency band by
closing the first switch to couple the transmission circuitry to the first filter and the one or more antennas, and
opening the second switch to uncouple the first filter and the one or more antennas from the second filter and the receiver circuitry.

3. The device of claim 2, wherein the controller is configured to transmit the transmit signal on a second frequency band non-overlapping with the first frequency band by
closing the first switch to couple the transmission circuitry to the first filter and the one or more antennas, and
closing the second switch to couple the first filter and the one or more antennas to the second filter and the receiver circuitry.

4. The device of claim 3, wherein the controller is configured to select between the first frequency band and the second frequency band based on an indication of a communication mode.

5. The device of claim 3, comprising a third switch configured to couple the second filter to a ground terminal, the controller configured to transmit the transmit signal on the second frequency band by closing the third switch to couple the second filter to the ground terminal.

6. The device of claim 3, comprising additional receiver circuitry, a third filter communicatively coupled to the additional receiver circuitry, and a third switch configured to couple the one or more antennas and the first filter to the third filter and the additional receiver circuitry, the controller configured to receive a receive signal on a third frequency band non-overlapping with the first frequency band and the second frequency band.

7. The device of claim 6, wherein the first frequency band comprises frequencies between 24 Gigahertz (GHz) and 33 GHz, the second frequency band comprises frequencies between 37 GHz and 43 GHz, and the third frequency band comprises frequencies between 43 GHz and 48 GHz.

8. The device of claim 1, wherein the first filter comprises an inductor coupled in parallel with a capacitor.

9. An electronic device, comprising:
a first switch configured to couple one or more antennas and a first filter to a first low noise amplifier via a second filter;
a second switch configured to couple the one or more antennas and the first filter to a power amplifier; and
a controller configured to
cause the first switch to close to transmit, via the one or more antennas, one or more transmit signals corresponding to a first frequency range;
cause the second switch to close to receive, via the one or more antennas, one or more receive signals corresponding to the first frequency range; and
cause the first switch and the second switch to open to receive, via the one or more antennas, one or more receive signals corresponding to a second frequency range.

10. The electronic device of claim 9, wherein the controller is configured to cause the first switch and the second switch to close to transmit, via the one or more antennas, one or more transmit signals corresponding to the second frequency range.

11. The electronic device of claim 9, comprising a third switch configured to couple the one or more antennas and the first filter to a second low noise amplifier via a third filter.

12. The electronic device of claim 9, wherein the controller is configured to receive a status indicating which of the first frequency range or the second frequency range to use.

13. The electronic device of claim 9, wherein the first frequency range comprises frequencies between 24 Gigahertz (GHz) and 33 GHz and the second frequency range comprises frequencies between 37 GHz and 43 GHz.

14. The electronic device of claim 9, wherein the controller is configured to couple the second filter to the one or more antennas and the first filter at least in part by coupling the second filter to a reference voltage terminal.

15. The electronic device of claim 9, wherein the second filter is configured to attenuate a range of frequencies based at least in part on an impedance characterizing circuitry of the second filter.

16. A method, comprising:
receiving, via processing circuitry, an indication of an operational state of one or more antennas, the one or more antennas coupled to a first filter and configured to couple to a second filter; and
causing, via the processing circuitry, the one or more antennas to transmit signals of a first frequency band or of a second frequency band based on selective coupling of the one or more antennas to the second filter, of the first filter to a transmitter, or a combination thereof, the selective coupling being based on the operational state of the one or more antennas.

17. The method of claim 16, wherein causing, via the processing circuitry, the one or more antennas to transmit signals of the first frequency band or of the second frequency band comprises causing, via the processing circuitry, the first filter to be communicatively coupled to the transmitter and the second filter to be communicatively coupled to the one or more antennas to transmit signals using the second frequency band.

18. The method of claim 16, wherein causing, via the processing circuitry, the one or more antennas to transmit signals of the first frequency band or of the second frequency band comprises causing, via the processing circuitry, the first filter to be communicatively coupled to the transmitter and the second filter to be communicatively decoupled from the one or more antennas to transmit signals of the first frequency band.

19. The method of claim 16, wherein the indication of the operational state comprises an indication of a frequency band and an indication of a transmission or reception operation.

20. The method of claim 16, comprising
receiving, via the processing circuitry, an indication that there is no subsequent transmission or reception operation, and
decreasing, via the processing circuitry, an amount of power supplied to a power amplifier coupled to the transmitter based on the indication.

* * * * *